(12) United States Patent
Lin et al.

(10) Patent No.: US 7,033,442 B2
(45) Date of Patent: Apr. 25, 2006

(54) SYSTEM AND METHOD FOR VENTILATION IN THE FABRICATION OF INTEGRATED CIRCUITS

(75) Inventors: I-Kai Lin, Hsinchu (TW); Jia-Rong Chen, Jhu-bei (TW)

(73) Assignee: Taiwan Semiconductor Manufacturing Co., Ltd., Hsin-chu (TW)

(*) Notice: Subject to any disclaimer, the term of this patent is extended or adjusted under 35 U.S.C. 154(b) by 223 days.

(21) Appl. No.: 10/696,407

(22) Filed: Oct. 29, 2003

(65) Prior Publication Data

US 2005/0092436 A1 May 5, 2005

(51) Int. Cl.
C23C 16/00 (2006.01)
C23F 1/00 (2006.01)
H01L 21/306 (2006.01)
F16L 55/00 (2006.01)
F16L 39/04 (2006.01)

(52) U.S. Cl. .................. 118/663; 118/715; 156/345.24; 285/13; 285/14; 285/121.4

(58) Field of Classification Search ................ 118/715, 118/663; 156/345.24; 285/13, 14, 121.4
See application file for complete search history.

(56) References Cited

U.S. PATENT DOCUMENTS

| 4,282,743 | A | * | 8/1981 | Pickett ........................... 73/46 |
| 4,325,600 | A |  | 4/1982 | Nestor .......................... 439/523 |
| 5,312,137 | A | * | 5/1994 | Nee .............................. 285/14 |
| 5,489,124 | A | * | 2/1996 | Nee et al. ....................... 285/14 |
| 5,831,149 | A | * | 11/1998 | Webb ........................ 73/40.5 R |
| 5,957,503 | A | * | 9/1999 | Brown .......................... 285/13 |
| 6,234,221 | B1 | * | 5/2001 | Clark, II ...................... 141/197 |
| 6,326,574 | B1 | * | 12/2001 | Huang et al. .................. 219/50 |
| 6,430,988 | B1 | * | 8/2002 | Watanabe ................ 73/40.5 A |
| 2002/0023677 | A1 | * | 2/2002 | Zheng et al. ................ 137/240 |
| 2002/0152797 | A1 |  | 10/2002 | McAndrew et al. ......... 73/23.2 |
| 2003/0037901 | A1 |  | 2/2003 | Kamm et al. ................ 164/113 |

* cited by examiner

Primary Examiner—Rudy Zervigon

(57) ABSTRACT

In the fabrication of semiconductor integrated circuits, a ventilation system is disclosed which includes a sleeve device, a ventilator and a sensor. The sleeve device has at least one aperture thereon for gas transfer. The ventilator is coupled to the sleeve device. The sensor is coupled to the sleeve device. A method of ventilation is also disclosed, which includes a step of sensing a relative movement between a sleeve having at least aperture for gas transfer and a gas outlet connected to a pipeline, and a step of generating a signal to control a ventilator when the relative movement between the sleeve and the gas outlet is sensed.

11 Claims, 5 Drawing Sheets

SYSTEM AND METHOD FOR VENTILATION IN THE FABRICATION OF INTEGRATED CIRCUITS

BACKGROUND OF THE INVENTION

1. Field of the Invention

The present invention relates to a system and a method for fabrication of semiconductor integrated circuits; more particularly, the present invention relates to a system and a method of ventilation for fabrication of semiconductor integrated circuits.

2. Description of the Related Art

The leakage of reacting gas through an gas outlet of a gas cabinet is often a problem in the fabrication of semiconductor integrated circuits when disconnection of a pipeline and the gas outlet of the gas cabinet is required. The gas leakage can cause safety issues and comprise fabrication of semiconductor integrated circuits.

FIG. 1 illustrates a schematic configuration showing a conventional gas supply apparatus. The gas supply apparatus includes a gas cabinet 100 having a gas outlet 110. A pipeline 120 is connected to the gas outlet 110 through a gasket 130. The gasket is adapted to seal the gas outlet 110 and prevent gas leakage from the gas outlet 110. When disconnection of the pipeline 120 and the gas outlet 110 is required, residual reacting gas may leak from the pipeline 120 to the atmosphere. The gas leakage may result in the manufacturing lines in a semiconductor factory being adversely affected.

U.S. patent application Ser. No. 2002/0108711 discloses a gas distribution apparatus of semiconductor equipment for preventing gas leakage. The apparatus includes a body having a plurality of gas inducing inlets on a downward grooved side of its plate and an injection plate screwed with the bottom surface of the body. The injection plate has small and large diameters of ring-shaped grooves on its upper surface to connect the gas inducing inlets. The grooves have injection holes formed at a predetermined interval for downward penetration, so as to completely prevent gas leakage outside.

Therefore, it is desirable to provide a system or a method to resolve the issues within the fabrication of semiconductor integrated circuits noted above.

SUMMARY OF THE INVENTION

A ventilation system is provided. The ventilation system includes a sleeve device, a ventilator and a sensor. The sleeve device has at least one aperture thereon for gas transfer. The ventilator and sensor are both coupled to the sleeve device.

A method of ventilation is also provided. The method of ventilation comprises a step of sensing a relative moving between a sleeve having at least aperture for gas transfer and a gas outlet connected to a pipeline, and a step of generating a signal to control a ventilator when the relative moving between the sleeve and the gas outlet is sensed.

DESCRIPTION OF THE PREFERRED EMBODIMENT

Figure 1:
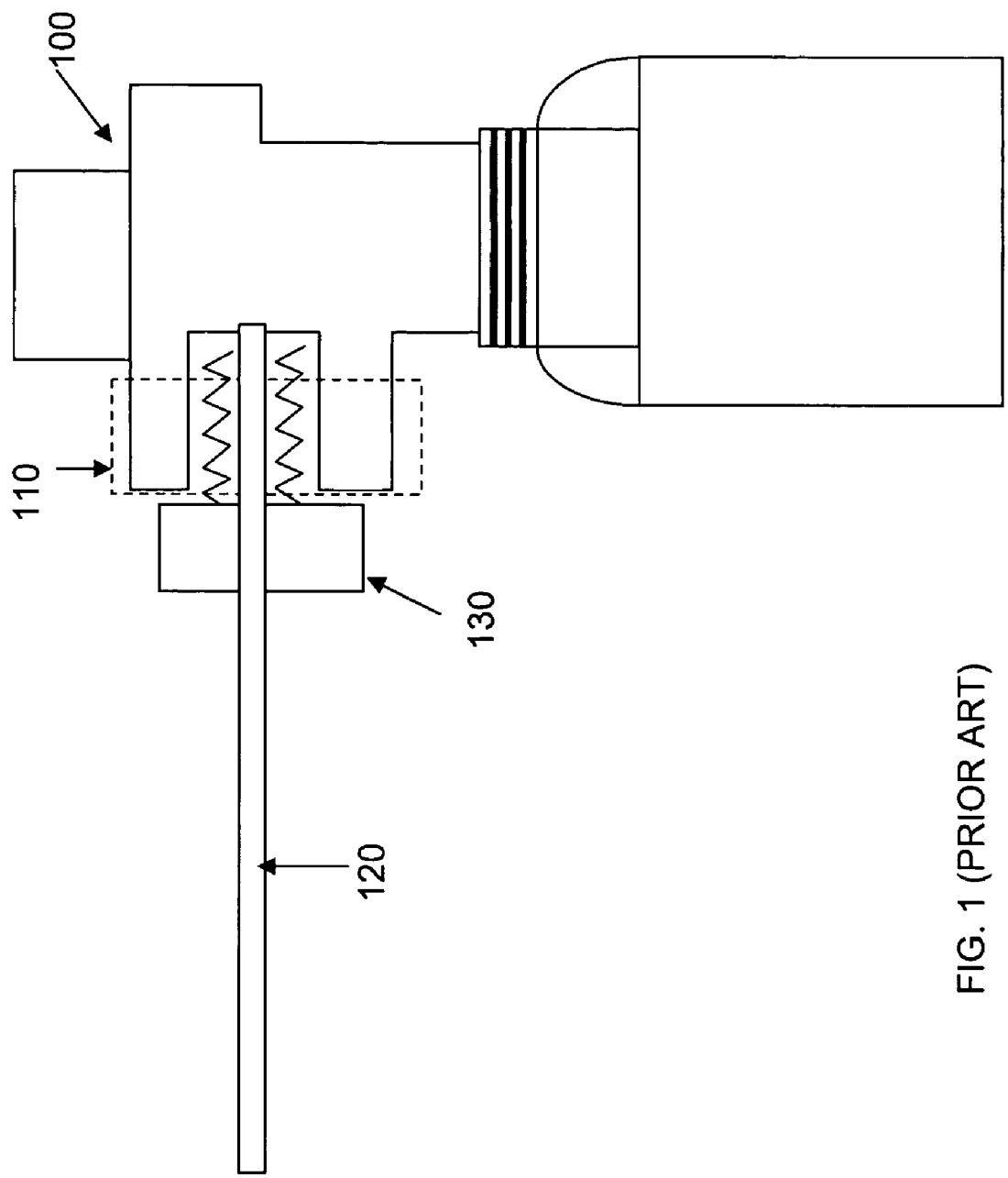
FIG. 1 illustrates a schematic configuration showing a conventional gas supply apparatus.
Figure 2:
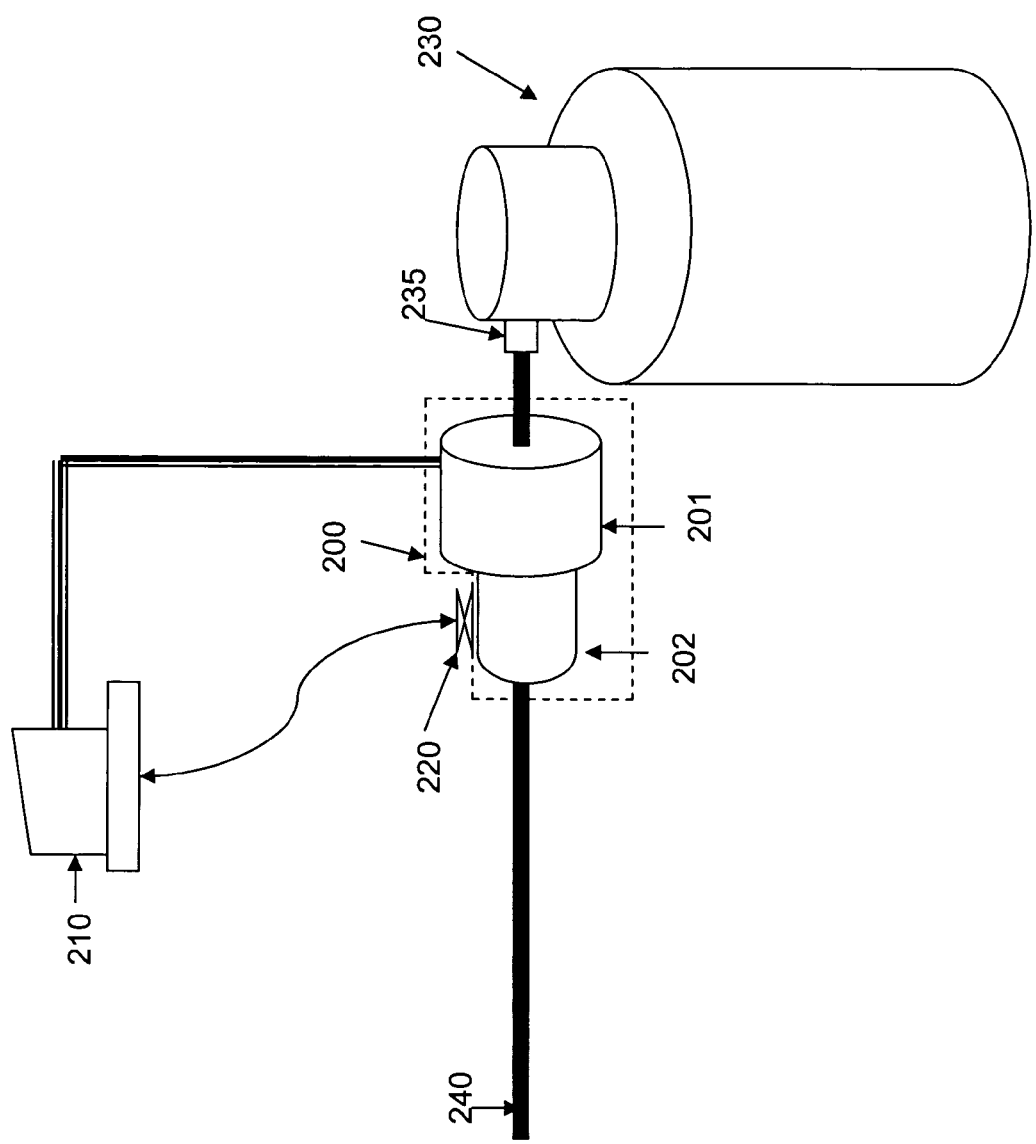
FIG. 2 illustrates a schematic configuration of an exemplary ventilation system in accordance with the present invention.

FIG. 2 illustrates a schematic configuration of an exemplary ventilation system. The ventilation system includes a sleeve device 200 having at least one aperture thereon for gas transfer, a ventilator 210 coupled to the sleeve device 200 and a sensor 220 coupled to the sleeve device 200. The sleeve device 200 includes at least one sleeve. In these embodiments shown in FIG. 2, the sleeve device 200 comprises a first sleeve 201 and a second sleeve 202 connected thereto. In some embodiments, the at least one aperture not shown is on the inner wall of the sleeve device 200. As shown in FIG. 2, the pipeline 240 connects the sleeve device 200 and a gas cabinet 230. In these embodiments, the sleeve device 200 is adjacent to a gas outlet 235 of the gas cabinet 230. Moreover, the sleeve device 200 and the pipeline 240 are substantially coaxial. In some embodiments, the ventilator 210 is coupled to the outer wall of the sleeve device 200.

The sleeve device 200 is adapted to transfer gas through the aperture thereon and between the inner and outer walls thereof. Moreover, the design of the sleeve device 200 is adapted to connect with the physical feature of the gas outlet 235 of the gas cabinet 230. The sleeve device 200 can be, for example, cylindrical, rectangular or any other shape that is suitable for connecting the sleeve device 200 to the gas outlet 235 of the gas cabinet 230. The ventilator 210 is adapted to vent the gas flowing through the sleeve device 200. In some embodiments, the ventilator 210 can be, for example, a vacuum generator. The term "couple to" describing the relationship between the ventilator 210 and the sleeve device 200 means that the ventilator 210 and the sleeve device 200 can be, e.g., directly connected, connected through another device, such as a pipeline, or connected by any other method that can substantially perform the function of transferring gas from the sleeve device 200 to the ventilator 210, or vice versa. The sensor 220 can be, for example, a sensor that can sense a relative moving between two objects, such as the sleeve device 200 and the gas outlet 235 of the gas cabinet 230, or the first sleeve 201 and the second sleeve 202. In some embodiments, the sensor 220 includes a switch coupled to the sleeve device 200 for sensing a relative movement between the first sleeve 201 and the second sleeve 202. The sensor 220 will then generate a signal to control the ventilator 210 when sensing a relative movement between the sleeve device 200 and the gas outlet 235 of the gas cabinet 230, or the first sleeve 201 and the second sleeve 202, for example. The signal transfer can be accomplished by a standard industrial interface, such as RS232, RS486 or IEEE488.2. The term "couple to" describing the relationship between the sensor 220 and the sleeve device 200 means that the sensor 220 and the sleeve device 200 can be, e.g., directly connected, connected through the other device, such as a signal cable, or connected by any other method that can substantially perform the function of sensing a relative movement between two objects.

Figure 3:
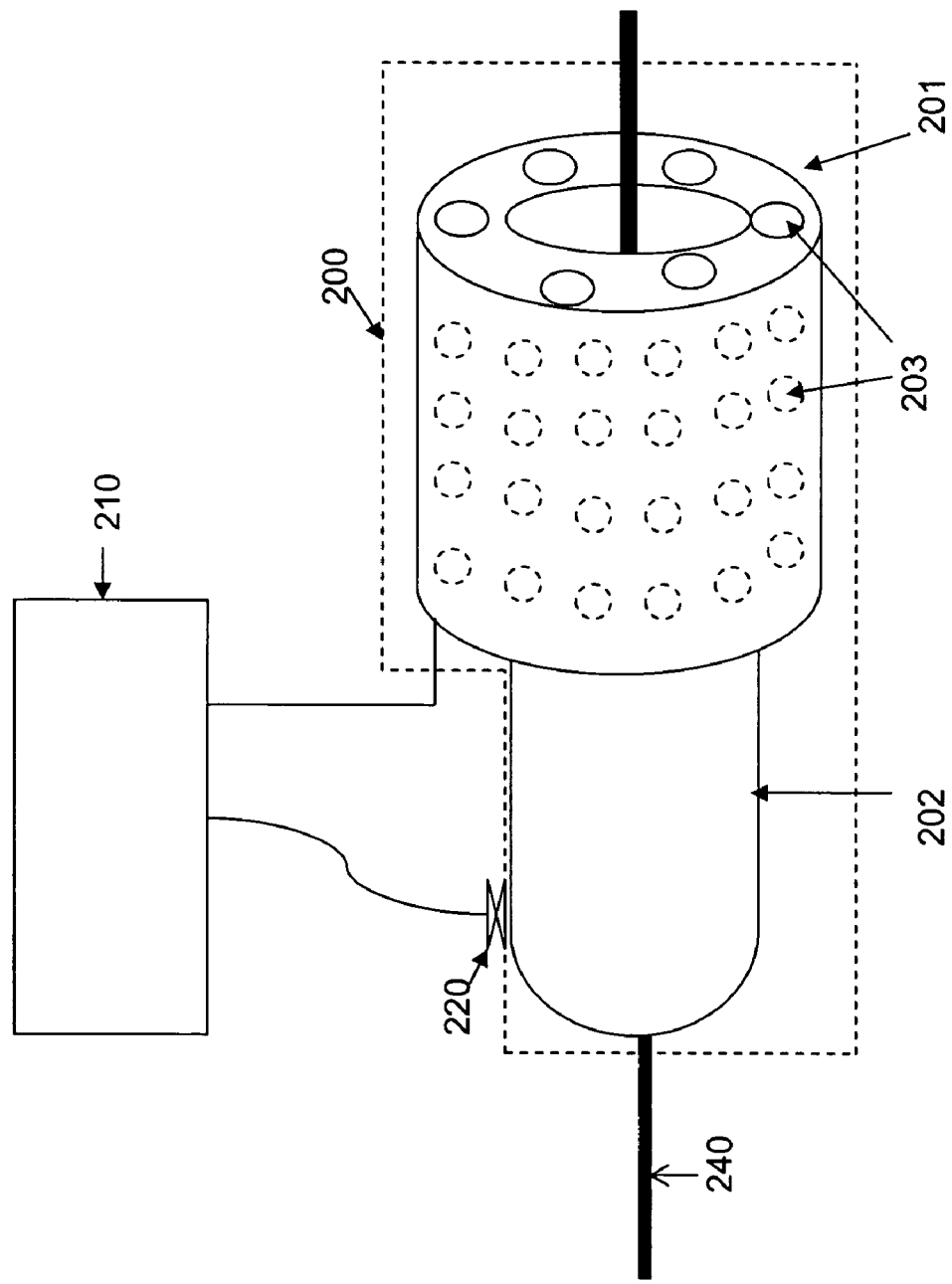
FIG. 3 illustrates a schematic configuration of an exemplary sleeve device in accordance with the invention.

FIG. 3 illustrates a schematic configuration of an exemplary sleeve device. As shown in FIG. 3, the sleeve device 200 includes the first sleeve 201 and the second sleeve 202. The pipeline 240 connects the first sleeve 201 and the second sleeve 202. Items in FIG. 3 that are the same as items in FIG. 2 are indicated by the same reference numerals. Detailed descriptions of each of these items are not repeated. In these embodiments shown in FIG. 3, at least one aperture 203 is on the inner wall of the first sleeve 201.

As mentioned in FIG. 2, the sleeve device 200 can have any physical feature suitable for connecting the sleeve device 200 to the gas outlet 235 of the gas cabinet 230. In these embodiments shown in FIG. 3, the sleeve device 200 including the first and second sleeves 201 and 202 respectively is cylindrical. Moreover, the first sleeve 201 can move on the second sleeve 202 along the pipeline 240 toward a gas outlet. The at least one aperture 203 on the inner wall of the first sleeve 201 can be any shape, for example, round or square. There is no requirement as to how many apertures may be on the inner wall of the first sleeve 201. However, it is more advantageous that the number of the apertures 203 are enough for efficiently transferring gas. In the embodiments shown in FIG. 3, the sensor 220 is coupled to the second sleeve 202 and is adapted to sense the relative moving between the first sleeve 201 and the second sleeve 202. The ventilator 210 is coupled to the outer wall of the first sleeve 201. It may be readily understood that the sensor 220 can be coupled to the first sleeve 201, the second sleeve 202 or both, and that the ventilator 210 can coupled to the first sleeve 201, the second sleeve 202 or both.

Figure 4A:
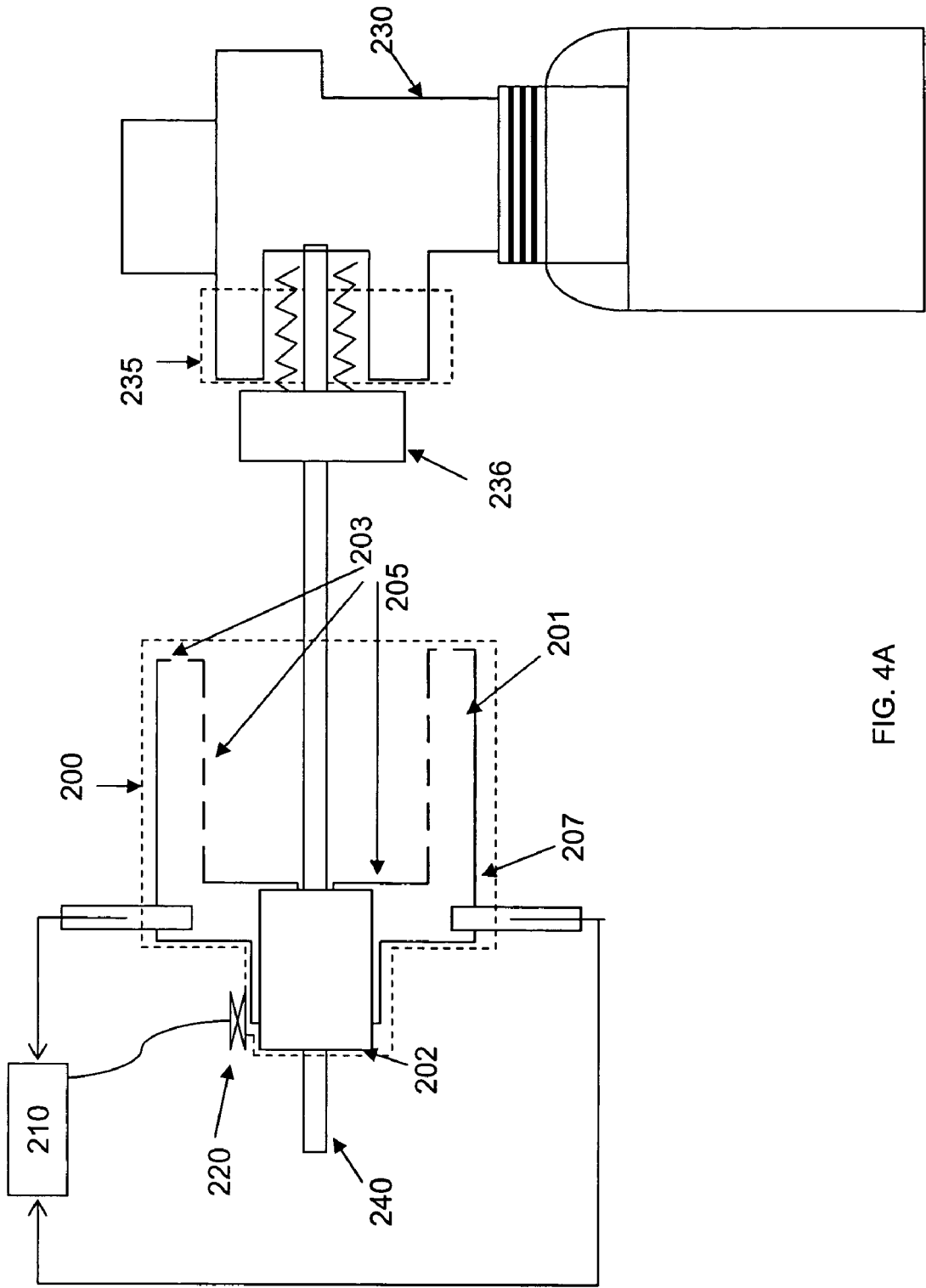
FIG. 4A illustrates a schematic cross-sectional configuration of an exemplary embodiment showing the ventilation system in accordance with the invention.

FIG. 4A illustrates a schematic cross-sectional configuration of an exemplary embodiment showing a non-operational situation of the ventilation system. Items in FIG. 4A that are the same as items in FIGS. 2 and 3 are indicated by the same reference numerals. They include the gas cabinet 230, the gas outlet 235 of the gas cabinet 230, the first sleeve 201, the second sleeve 202, the apertures 203, the ventilator 210, the sensor 220 and the pipeline 240. Detailed descriptions of these items are not repeated. The first sleeve 201 has an inner wall 205 and an outer wall 207.

As noted in FIG. 2, the sleeve device 200 including the first and second sleeves 201 and 202 respectively is adjacent to the gas outlet 235 of the gas cabinet 230. In these embodiments shown in FIG. 4A, a gasket 236 connects to the gas outlet 235 of the gas cabinet 230 for sealing the gas outlet 235 and preventing gas leakage therefrom. When the sleeve device 200 does not create a relative movement to the gas outlet 235 of the gas cabinet 230, or the first sleeve 201 does not create a relative movement to the second sleeve 202, the sensor does not create a signal and sent to the ventilator 210. Therefore, no ventilation occurs under this situation.

Figure 4B:
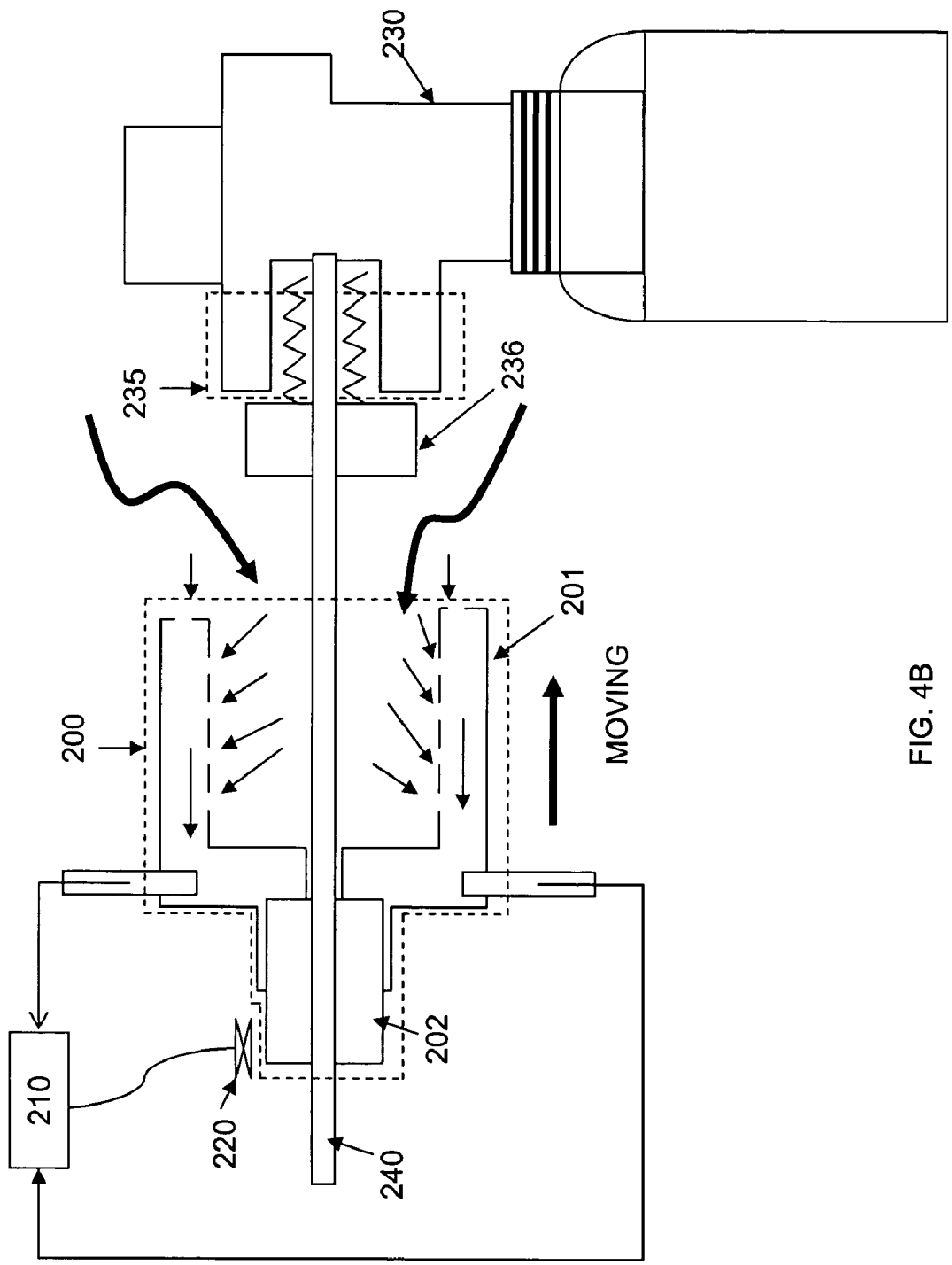
FIG. 4B illustrates a schematic cross-sectional configuration of an exemplary embodiment showing the ventilation system in operation in accordance with the present invention.

FIG. 4B illustrates a schematic cross-sectional configuration of an exemplary embodiment showing the ventilation system in operation. Items in FIG. 4B that are the same as items in FIG. 4A are indicated by the same reference numerals.

For disconnection of the pipeline 240 and the gas outlet 235 of the gas cabinet 230, the gasket 236 is released from its connection to the gas outlet 235 of the gas cabinet 230. The first sleeve 201 then moves toward the gas outlet 235 of the gas cabinet 230 along the pipeline 240, and creates a relative movement between the first sleeve 201 and the second sleeve 202, or between the sleeve device 200 and the gas outlet 235 of the gas cabinet 230. The sensor 220 can sense the relative movement and generate a signal to control the ventilator 210. In embodiments, the ventilator 210 starts venting gas leaked from the gas outlet 235 of the gas cabinet 230. The leakage gas will flow through the aperture 203 of the first sleeve 201 and between the inner and outer walls of the first sleeve 201 to the ventilator 210.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. In the fabrication of semiconductor integrated circuits, a ventilation system, comprising: (a) a sleeve device having at least one aperture thereon for gas transfer, wherein the sleeve device comprises a first and second sleeve connected thereto; (b) a ventilator coupled to the sleeve device; and (c) a sensor coupled to the second sleeve, wherein the sensor is adapted to generate a signal to control the ventilator when the sensor senses a relative movement between the first sleeve and the second sleeve.

2. The ventilation system of claim 1, wherein the at least one aperture is on an inner wall of the sleeve device.

3. The ventilation system of claim 1, wherein the sleeve device is connected to a pipeline.

4. The ventilation system of claim 3, wherein the sleeve device is adjacent to a gas outlet that is connected to the pipeline.

5. The ventilation system of claim 4, wherein the sleeve device and the pipeline are substantially coaxial.

6. The ventilation system of claim 1, wherein the ventilator is coupled to an outer wall of the sleeve device.

7. The ventilation system of claim 4, wherein the sensor is adapted to generate a signal to control the ventilator when the sensor senses a relative movement between the sleeve device and the gas outlet.

8. In the fabrication of semiconductor integrated circuits, a ventilation system, comprising: (a) a sleeve device connected to a pipeline, having at least one aperture on an inner wall thereof, wherein the sleeve device comprises a first and second sleeve connected thereto; (b) a ventilator coupled to an outer wall of the sleeve device; and (c) a sensor coupled to the second sleeve, wherein the sensor is adapted to generate a signal to control the ventilator when the sensor senses a relative movement between the first sleeve and the second sleeve.

9. The ventilation system of claim 8, wherein the sleeve device is adjacent to a gas outlet that is connected to the pipeline.

10. The ventilation system of claim 8, wherein the sleeve device and the pipeline are substantially coaxial.

11. The ventilation system of claim 9, wherein the sensor is adapted to generate a signal to control the ventilator when the sensor senses a relative movement between the sleeve device and the gas outlet.

* * * * *